United States Patent [19]
Kobayashi et al.

[11] Patent Number: 5,895,541
[45] Date of Patent: Apr. 20, 1999

[54] TRANSFER METHOD FOR RELIEF PATTERNS

[75] Inventors: Koichi Kobayashi; Wataru Iwanami; Taiyo Kanai; Hideki Horiuchi, all of Suwa, Japan

[73] Assignee: Seiko Epson Corporation, Tokyo, Japan

[21] Appl. No.: 08/381,988

[22] PCT Filed: May 25, 1994

[86] PCT No.: PCT/JP94/00831

§ 371 Date: May 26, 1995

§ 102(e) Date: May 26, 1995

[87] PCT Pub. No.: WO94/29128

PCT Pub. Date: Dec. 22, 1994

[30] Foreign Application Priority Data

Jun. 8, 1993 [JP] Japan ................... 5-137893

[51] Int. Cl.$^6$ ............... B32B 31/24; B32B 31/12
[52] U.S. Cl. ........... 156/240; 156/272.2; 156/273.3; 156/275.5; 156/275.7; 156/289
[58] Field of Search .................. 156/155, 272.2, 156/273.3, 274.8, 275.5, 239, 240, 289, 275.7; 430/14, 15

[56] References Cited

U.S. PATENT DOCUMENTS

| | | | |
|---|---|---|---|
| 3,054,175 | 9/1962 | Spreter | 29/527 |
| 3,721,557 | 3/1973 | Inoue | 96/28 |
| 4,552,829 | 11/1985 | Masaki | 430/258 |
| 5,232,814 | 8/1993 | Graves et al. | 430/158 |

*Primary Examiner*—Curtis Mayes
*Attorney, Agent, or Firm*—Stroock & Stroock & Lavan LLP

[57] ABSTRACT

A parting layer 12, colored layer 13, reflective layer 14, and photosensitive resin layer 15 are laminated to base film 11 of relief pattern transfer sheet 10. When forming letters on the face of a timepiece, photosensitive resin layer 15 is first exposed through negative film 16. Mask areas 161 of a pattern corresponding to the letters are formed in negative film 16. Therefore, when photosensitive resin layer 15 is developed by a water wash, molded resin layer 150 of the specified pattern is left on base film 11 with parting layer 12, colored layer 13, and reflective layer 14. Pressure-sensitive adhesive layer 17 is then formed only on the surface of molded resin layer 150, and relief pattern transfer sheet 10 is bonded to the timepiece face. When relief pattern transfer sheet 10 is thereafter pulled off of the timepiece face, reflective layer 14 and colored layer 13 corresponding to the areas in which molded resin layer 150 is formed are also transferred to the timepiece face.

13 Claims, 11 Drawing Sheets

TRANSFER METHOD FOR RELIEF PATTERNS

FIELD OF THE INVENTION

The present invention relates to a sheet for transferring a relief pattern and to a method for transferring relief patterns using this sheet, and relates particularly to a technique for forming a relief pattern on this relief pattern transfer sheet and transferring this pattern to the decorated surface.

DESCRIPTION OF THE PRIOR ART

When conventionally applying a relief pattern of raised letters, symbols, or other raised marks on a sign plate, watch face, or similar flat surface, one side of the base 70 being decorated is processed by a monolithic molding and drawing press to form a simplified character 71 as a raised impression, and the entire surface of base 70 is then coated (see prior art FIG. 9 (A)). When base 70 is plated rather than being coated, a transparent protective coating is applied to the surface of base 70 to protect or insulate the surface. In this case, that part of the protective coating layer corresponding to simplified character 71 is cut away using a diamond bit or is removed by grinding or polishing to expose the surface of base 70, and a decorative plating layer 72 is then formed.

Alternatively, as shown in prior art FIG. 9 (B), the surface of base 70 is finished as specified, and simplified character 71 is then formed as a raised impression by an embossing technique using a press. In this case, too, however, the surface (bare metal) of base 70 is exposed by cutting with a diamond bit or grinding, and a decorative plating layer 72 is then formed over the exposed area.

Note that in both methods shown in prior art FIGS. 9 (A) and (B), anodizing is used instead of plating when base 70 is aluminum.

With both of the methods shown in prior art FIGS. 9 (A) and (B), however, a profile is required for press molding or injection molding, but profiles used in such processes are expensive and require a relatively long time to manufacture. As a result, manufacturing small lots of many different products incurs relatively high costs with long delivery times. In addition, the use of a profile imposes strict limits on the product shape, e.g., manufacturing long, thin parts, finely detailed parts, and parts with complex relief patterns is difficult. In addition, because simplified character 71 is integral to base 70, it is difficult to use different finishing processes for base 70 and simplified characters 71.

Another method is shown in prior art FIG. 9 (C). In this method, holes 73 are formed in the face of base 70, and simplified character 74, which is formed separately from base 70 by a press, injection molding, or other process, is then implanted to holes 73 in base 70. In this method, the individually manufactured simplified character 74 is coated with the decorative finish 76 before being implanted to base 70. Note that pins 75 of simplified character 74 are treated with adhesive or are crimped or caulked to secure simplified character 74 in base 70.

The problem with this method is that a profile must be used to manufacture raised simplified characters 74, and as stated above such materials are expensive. In addition, processing and handling small components such as simplified characters 74 is tedious and time-consuming. In order to insert pins 75 to holes 73, it is also necessary to form pins 75 on simplified character 74, form holes 73 in base 70, and to position pins 75 to holes 73 with good precision. Each of these additional processes requires additional time.

A decorating method using relief pattern transfer sheet 80 as shown in prior art FIG. 10 (A) is described in Japanese patent laid-open number 1991-50000 as a method of resolving these problems. With this relief pattern transfer sheet 80, adhesive layer 82 and metal vapor deposition film 83 comprising plastic film 83a and metal vapor deposition layer 83b are laminated to the surface of parting sheet 81, and decoration is applied as follows.

First, an ink layer 85 of the specified pattern is formed on the surface side of metal vapor deposition film 83 using printing plate 84 as shown in prior art FIG. 10 (B).

Next, metal vapor deposition film 83 and adhesive layer 82 in the areas S corresponding to where ink layer 85 is not applied are dissolved and removed from relief pattern transfer sheet 80 using alcohol, methyl ethyl ketone, lacquer thinner, acetone, or a similar chemical. This leaves the areas masked by ink layer 85 and not dissolved by the chemicals as decorative areas 86 in parting sheet 81 (see prior art FIG. 10 (D)).

Next, as shown in prior art FIG. 10 (E), masking sheet 88 is placed over the surface of relief pattern transfer sheet 80, sandwiching adhesive layer 87 therebetween to hold parts 86.

Thereafter, if parting sheet 81 is removed and parts 86 are transferred to the vehicle body or other decorated part using adhesive layer 82, a relief pattern can be applied to the decorated area without irregular processing.

However, while this pattern formation method is suited to stickers and other products applied to a vehicle body, it is not possible to form parts 86 with finely detailed contours because printing, hot stamping, or other line formation methods are used. In addition, safety-related problems are created simply by the use of organic solvents.

On the other hand, a decorative method using relief pattern transfer sheet 90 shown in prior art FIG. 11 (A) is described in Japanese patent laid-open number 1992-186246 as a decorative method suited to transferring fine patterns. With this relief pattern transfer sheet 90, a parting layer 92 and ink layer 93 are laminated to the surface of base film 91, and photosensitive layer 94 comprising a polyvinyl acetate emulsion, methyal derivatives of polyvinyl alcohol, and a water soluble diazo compound is formed on the surface of ink layer 93.

When a pattern is applied using this relief pattern transfer sheet 90, a negative film 95 containing the specified pattern is applied over the surface of photosensitive layer 94 as shown in prior art FIG. 11 (B). Photosensitive layer 94 is then exposed as shown in prior art FIG. 11 (C), and water washed to remove photosensitive layer 94 in the unexposed areas as shown in prior art FIG. 11 (D). Photosensitive layer 94 is then used as a mask to selectively remove ink layer 93 and parting layer 92 using organic solvents. The parts remaining are parts 95 forming the desired pattern.

Next, as shown in prior art FIG. 11 (E), adhesive layer 96 is formed on the surface of relief pattern transfer sheet 90, and parts 95 are applied to the decorated part by means of adhesive layer 96.

After negative film 95 is completely formed in relief pattern transfer sheet 90 using photoengraving techniques, organic solvents must be used to pattern ink layer 93 after water-washing photosensitive layer 94 in order to apply negative film 95 to the decorated part. As a result, the problems with this method include both the complexity of the processes, and safety-related problems caused by the use of organic solvents. In addition, because one objective is also to overlay ink layers 93 of different colors, it is necessary to assure that the surface of relief pattern transfer sheet 90 is flat. There is also the more fundamental problem that relief patterns cannot be produced because the gaps between each of parts 95 are completely filled with adhesive. The edges of ink layer 93 left in the pattern also swell in the process selectively removing ink layer 93 with organic solvents, and fine patterns cannot be formed.

Therefore, the object of the present invention is to provide a relief pattern transfer sheet and a relief pattern formation method whereby fine relief patterns can be formed simply without using profiles or organic solvents.

DESCRIPTION OF THE INVENTION

To resolve the aforementioned problems, a relief pattern transfer sheet formed by laminating a parting layer, a colored layer, a reflective layer of a metal or metallic compound, and a photosensitive resin layer on the surface of a base film is used by means of three main processes: a photoengraving process for forming a molded resin layer by patterning the photosensitive resin layer of this relief pattern transfer sheet to the specified pattern using photoengraving techniques; a bonding process for bonding the surface of the molded resin layer and the decorated surface with an adhesive layer to bond the relief pattern transfer sheet and the decorated surface together; and a transfer process for transferring the molded resin layer to the decorated surface by peeling the relief pattern transfer sheet from the decorated surface, and simultaneously transferring the colored layer and reflective layer only in the molded part of this molded resin layer with the molded resin layer to the decorated surface by separating the colored layer and reflective layer in the molded part of the molded resin layer from the relief pattern transfer sheet.

In other words, after patterning the photosensitive resin layer to form the molded resin layer, the molded resin layer is bonded as the relief pattern directly to the decorated surface, and the relief pattern transfer sheet is then removed from the decorated surface to transfer the molded resin layer (relief pattern) to the decorated surface. At the same time, only the colored layer and reflective layer in the molded part of this molded resin layer are separated from the other parts of the colored layer and reflective layer laminated to the relief pattern transfer sheet, and are thereby transferred with the molded resin layer to the decorated surface. Therefore, if the thickness of the molded resin layer is changed, thin raised forms approximately 0.01 mm thick to approximately 0.5 mm thick can be easily transferred with high precision.

It is to be noted that relief patterns in the present invention include, in addition to normal patterns, raised letters, raised simplified characters, raised logo marks, and other raised patterns.

In a second embodiment of the present invention, a relief pattern transfer sheet comprising a parting layer, a colored layer, and a photosensitive resin layer laminated to the surface side of a base film is used by means of three main processes: a photoengraving process for forming a molded resin layer by patterning the photosensitive resin layer of this relief pattern transfer sheet to the specified pattern using photoengraving techniques; a bonding process for bonding the surface of the molded resin layer and the decorated surface with an adhesive layer to bond the relief pattern transfer sheet and the decorated surface together; and a transfer process for transferring the molded resin layer to the decorated surface by peeling the relief pattern transfer sheet from the decorated surface, and simultaneously transferring the colored layer only in the molded part of this molded resin layer with the molded resin layer to the decorated surface by separating the colored layer in the molded part of the molded resin layer from the relief pattern transfer sheet.

In a third embodiment of the present invention, a relief pattern transfer sheet comprising a parting layer, a colored reflective layer of a metal or metallic compound, and a photosensitive resin parting layer laminated to the surface side of a base film is used by means of three main processes: a photoengraving process for forming a molded resin layer by patterning the photosensitive resin layer of this relief pattern transfer sheet to the specified pattern using photoengraving techniques; a bonding process for bonding the surface of the molded resin layer and the decorated surface with an adhesive layer to bond the relief pattern transfer sheet and the decorated surface together; and a transfer process for transferring the molded resin layer to the decorated surface by peeling the relief pattern transfer sheet from the decorated surface, and simultaneously transferring the colored reflective layer only in the molded part of this molded resin layer with the molded resin layer to the decorated surface by separating the colored reflective layer in the molded part of the molded resin layer from the relief pattern transfer sheet.

In a fourth embodiment of the present invention, a relief pattern transfer sheet comprising a parting layer and a photosensitive resin layer laminated to the surface side of a base film is used by means of three main processes: a photoengraving process for forming a molded resin layer by patterning the photosensitive resin layer of this relief pattern transfer sheet to the specified pattern using photoengraving techniques; a bonding process for bonding the surface of the molded resin layer and the decorated surface with an adhesive layer to bond the relief pattern transfer sheet and the decorated surface together; and a transfer process whereby the relief pattern transfer sheet is peeled from the decorated surface to transfer the molded resin layer to the decorated surface.

In this case, the surface side of the transferred molded resin layer is printed over or otherwise treated. The photosensitive resin layer is also either dyed or colored.

The method of dying or coloring this photosensitive resin layer, and the method of printing or otherwise treating the surface of the molded resin layer, i.e., the colored layer and not the specific surface of the molded resin layer when a colored layer is formed on the surface of the molded resin layer, can also be used with any of the first through third embodiments described above. These printing or coloring methods can be used to achieve a variety of new color tones.

It is preferable in this invention to form the adhesive layer for bonding the relief pattern transfer sheet to the decorated surface by applying an adhesive coating to the entire surface of the photosensitive resin layer before the photoengraving process, and patterning this complete adhesive layer together with the photosensitive resin layer in the photoengraving process. This is because it thus becomes possible to eliminate selectively forming the adhesive layer on the surface of the molded resin layer during the bonding process.

It is further preferable in this invention to simultaneously form positioning tabs from the photosensitive resin layer while forming the molded resin layer in the photoengraving process, and in the adhesive process to position the decorated surface with the relief pattern transfer sheet based on these positioning tabs.

The relief pattern transfer method of the present invention can be used, for example, as a method for forming a pattern of simple characters for displaying the time on the face of a watch or clock. In this case, the photoengraving process patterns the photosensitive resin layer with the pattern of simple characters used to display the time on the watch or timepiece face, the face being the decorated surface.

The relief pattern transfer method of the present invention can further be used, for example, with stickers and seals having an irregular surface pattern. The decorated surfaces to which relief patterns be can transferred also include name plates, containers, and other products.

It is also preferable in this invention to use in the formation of the photosensitive resin layer a photosensitive resin sheet applied by means of adhesive to the base film.

DESCRIPTION OF PREFERRED EMBODIMENTS

The preferred embodiments of the present invention are described hereinbelow with reference to the accompanying figures.

First embodiment

Figure 1:
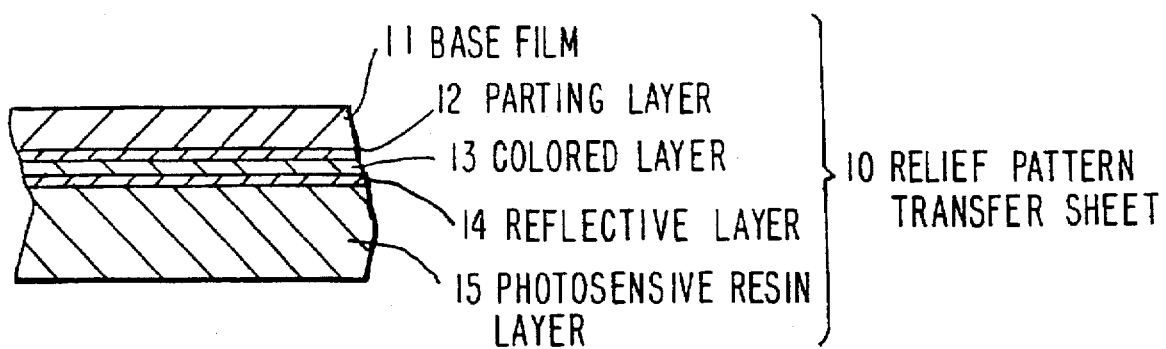
FIG. 1 is a cross section showing the structure of a relief pattern transfer sheet according to a first embodiment of the invention.
Figure 2A:
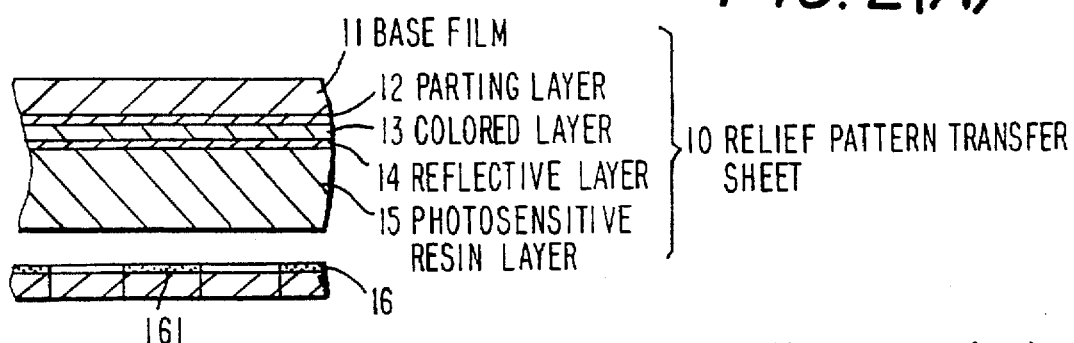
FIGS. 2 (A)–(E) are cross sections used to describe the processes of the method for forming in the relief pattern transfer sheet shown in FIG. 1 the character pattern to be transferred to the lettered panel.
Figure 2B:
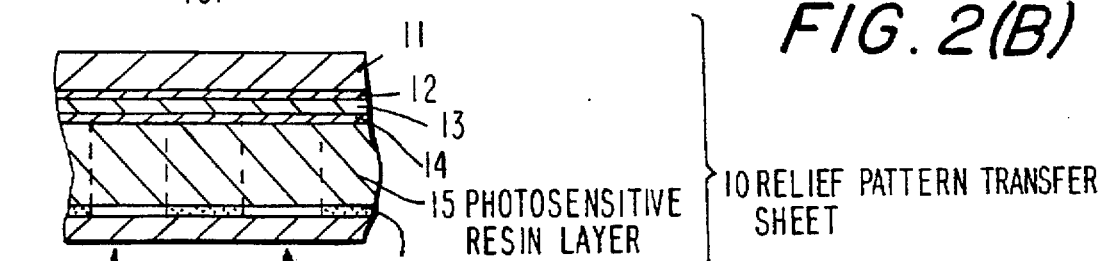
Figure 2C:
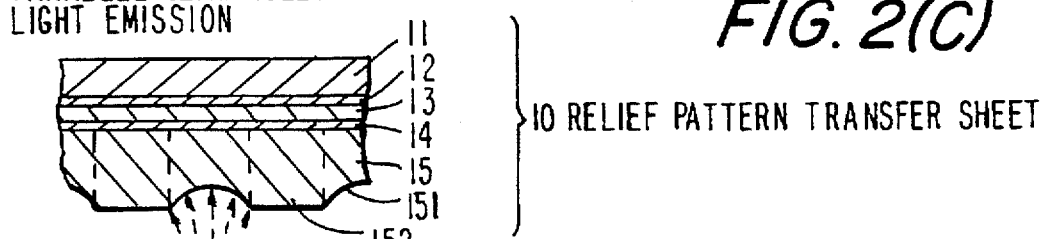
Figure 2D:
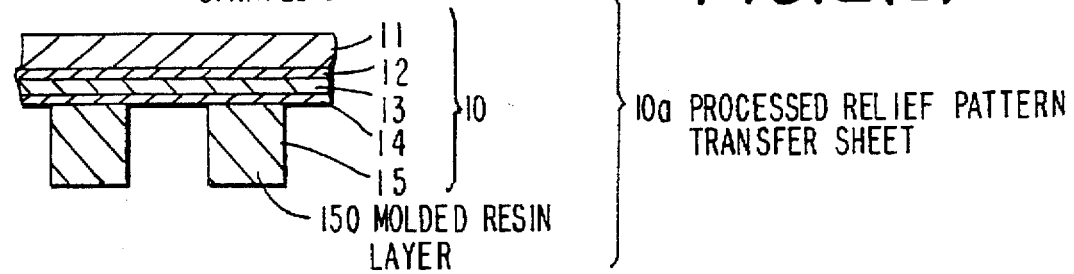
Figure 2E:
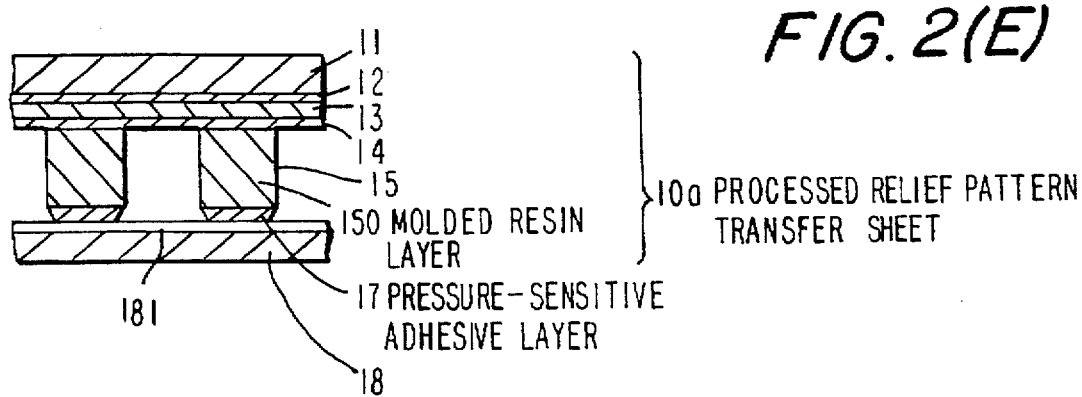

FIG. 1 is a cross section showing the structure of a relief pattern transfer sheet according to the first embodiment of the invention.

As shown in FIG. 1, the relief pattern transfer sheet 10 of this embodiment comprises parting layer 12, an approximately 2 μm thick colored layer 13, an approximately 0.05 μm thick reflective layer 14 of aluminum, and an approximately 0.2 mm thick photosensitive resin layer 15 laminated in sequence to the surface (the bottom side as shown in FIG. 1) of base film 11.

Base film 11 is a 0.02 mm thick polyester sheet, the surface of which is treated with a parting agent to form parting layer 12. It should be noted that the thickness of base film 11 affects the precision of relief pattern transfers, and a thicker base film 11 is therefore preferable. It is also preferable for base film 11 to have high heat resistance and low extensibility characteristics.

While there are no restrictions to the hue of colored layer 13, a transparent yellow ink layer applied by roll coating is used in this embodiment. Other methods of applying colored layer 13 to base film 11 may also be used, including shower coating, air spray coating, and printing, and the method best suited to the type and capacity of existing facilities, and the type of relief pattern transfer sheet being manufactured, can be selected.

Reflective layer 14 is a layer of vapor deposited aluminum, generally between approximately 0.01 μm–0.5 μm thick. Depending upon the type of material used, reflective layer 14 can be laminated to the surface of colored layer 13 using a method other than vacuum vapor deposition, including sputtering and ion plating.

Photosensitive resin layer 15 is a photosensitive agent layer applied evenly on the one side of base film 11 (over reflective layer 14) by roll coating. While photosensitive resin layer 15 is an extremely thin yellow color in this embodiment, any color may be used insofar as it does not affect exposure, i.e., any color enabling the sensitized groups in the polymer chain of the resin comprising photosensitive resin layer 15 to react can be used. Methods other than roll coating, including shower coating, air spray coating, and printing, may also be used to apply photosensitive resin layer 15 to the surface of reflective layer 14.

The method of applying three-dimensional lettering (relief patterns) for displaying the time on the face (decorated surface) of a timepiece(clock or watch) using relief pattern transfer sheet 10 as described above is described below.

First, as shown in FIG. 2 (A), negative film 16 is applied to the surface of photosensitive resin layer 15 of relief pattern transfer sheet 10. Mask areas 161 are formed in negative film 16 in a pattern that is the negative of the letters to be transferred to the timepiece face (decorated surface).

Next, as indicated by arrows P in FIG. 2 (B), photosensitive resin layer 15 is exposed to parallel ultraviolet light emitted through negative film 16. Exposure at this time is approximately sixty seconds of parallel light emitted from a 4-kW extra-high pressure mercury vapor lamp positioned approximately one meter from negative film 16. As a result, areas 151 corresponding to mask areas 161 in photosensitive resin layer 15 are masked by negative film 16 and therefore not exposed to the ultraviolet light, and do not harden. Those areas 152 of photosensitive resin layer 15 not masked by mask areas 161 are therefore exposed to the ultraviolet light and harden. This is the exposure process.

As a result, when negative film 16 is removed and photosensitive resin layer 15 is sprayed with a shower of water used as the developer solution as indicated by arrows A in FIG. 2 (C), only areas 151 masked by mask areas 161 are dissolved and removed by the developer solution. Areas 152 not masked by mask areas 161 are not dissolved, and therefore remain. This is the developing process.

As a result, photosensitive resin layer 15 is left as molded resin layer 150 with parting layer 12, colored layer 13, and reflective layer 14 also remaining on the surface of base film 11 as shown in FIG. 2 (D).

Relief pattern transfer sheet 10 is then dried for approximately five minutes at 80° C., and the entire surface of photosensitive resin layer 15 is exposed to parallel ultraviolet light for postexposure of photosensitive resin layer 15. The same exposure conditions are used for this postexposure process: approximately 60 seconds of parallel light emitted from a 4-kW extra-high pressure mercury vapor lamp positioned approximately one meter from photosensitive resin layer 15.

By means of this photoengraving process, relief pattern transfer sheet 10 becomes processed relief pattern transfer sheet 10a with photosensitive resin layer 15 patterned according to the shape of the letters.

Before processed relief pattern transfer sheet 10a is then stored or sold, an approximately 15 µm thick pressure-sensitive adhesive layer 17 is formed only on the surface of molded resin layer 150 as shown in FIG. 2 (E), and pressure-sensitive adhesive layer 17 is covered with cover sheet 18 having a parting layer 181.

In the process forming pressure-sensitive adhesive layer 17, a silk-screening process using a printing plate with a printing pattern matching molded resin layer 150 is used. It should be noted, however, that because molded resin layer 150 has a raised pattern, it is possible to selectively apply pressure-sensitive adhesive layer 17 only to the surface of molded resin layer 150 even using a printing plate resulting in solid printing. Note also that using plates for solid printing offers the advantage of not needing to change the printing plate when the pattern of molded resin layer 150 changes. It is also possible to selectively apply pressure-sensitive adhesive layer 17 only to the surface of molded resin layer 150 using roll coating and other methods.

The method of transferring letters to the timepiece face using this processed relief pattern transfer sheet 10a is described below with reference to FIG. 3.

Figure 3A:
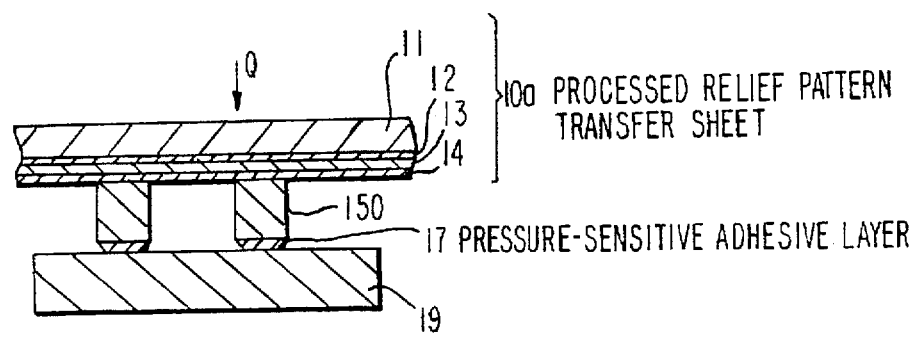
FIGS. 3 (A)–(C) are cross sections used to describe the processes for transferring the character pattern formed in the relief pattern transfer sheet shown in FIG. 1 to the lettered panel.
Figure 3B:
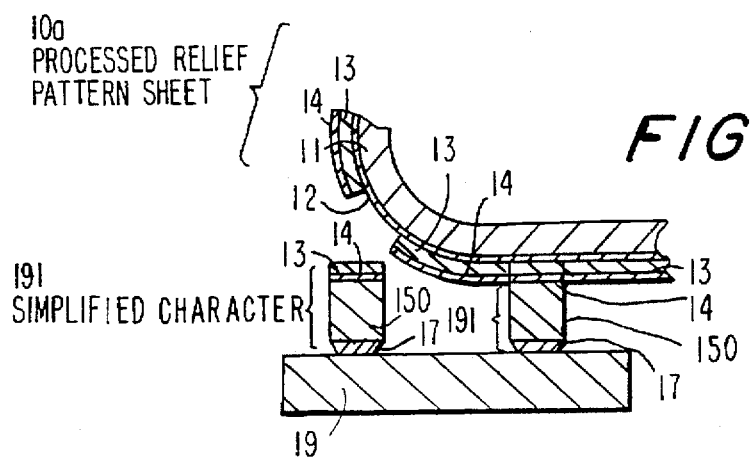
Figure 3C:
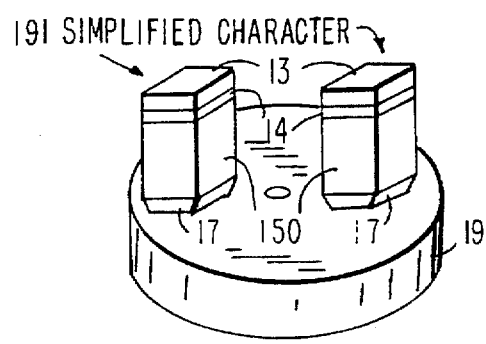
Figure 4A:
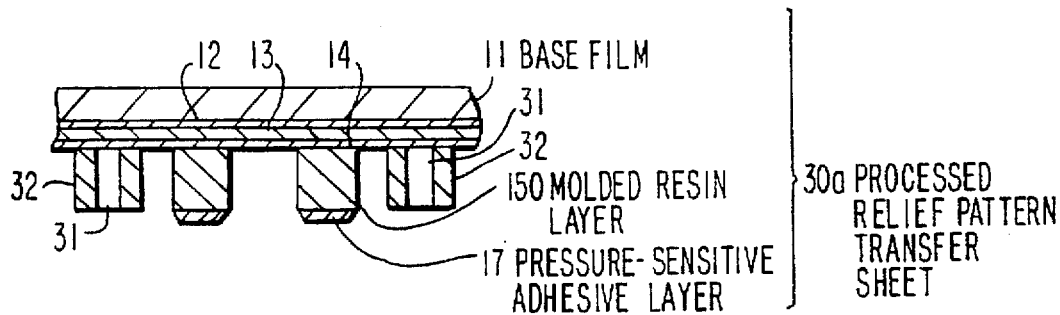
FIGS. 4 (A)–(D) are cross sections used to describe the processes of the relief pattern transfer method of the second embodiment of the invention.
Figure 4B:
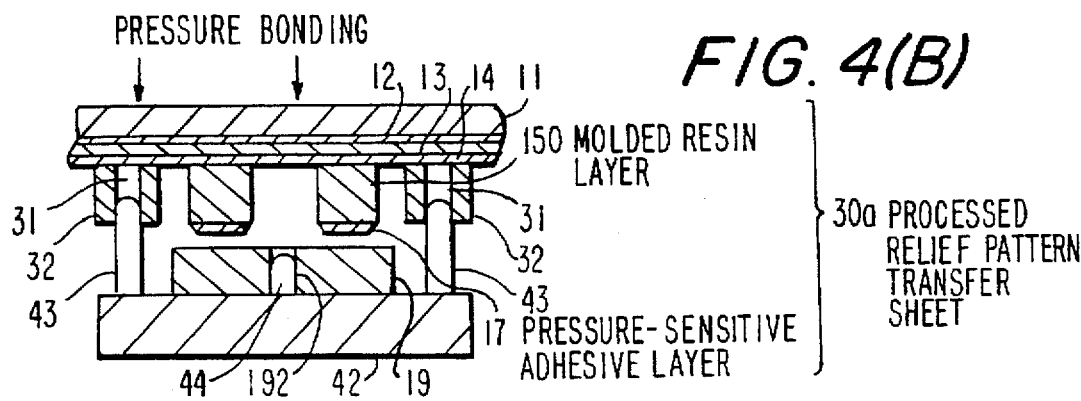
Figure 4C:
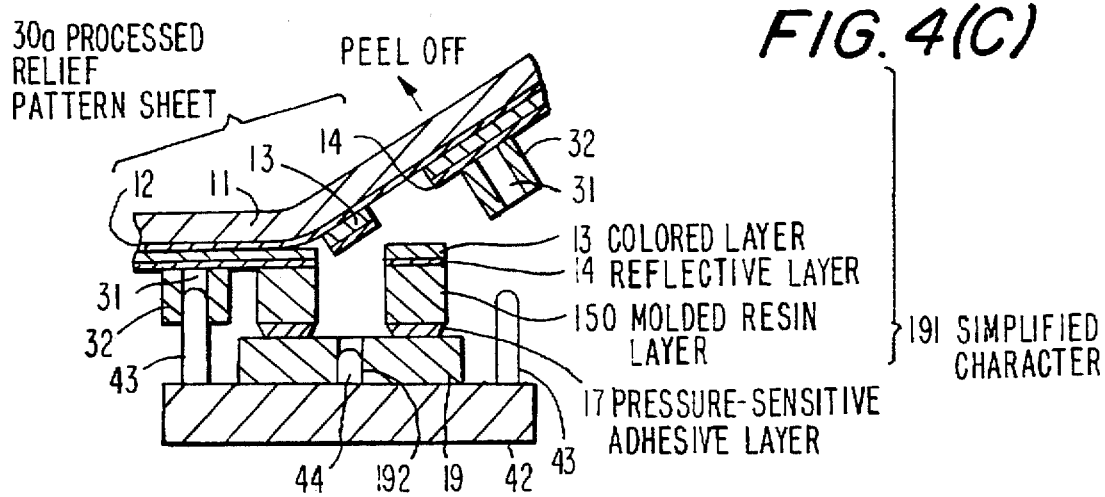
Figure 4D:
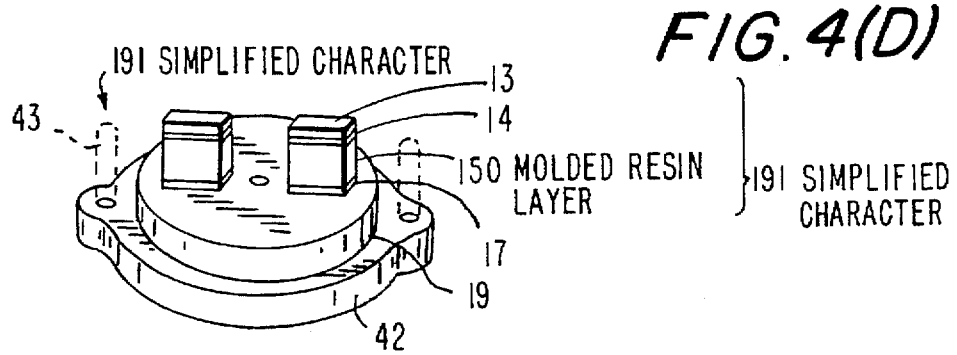
Figure 5A:
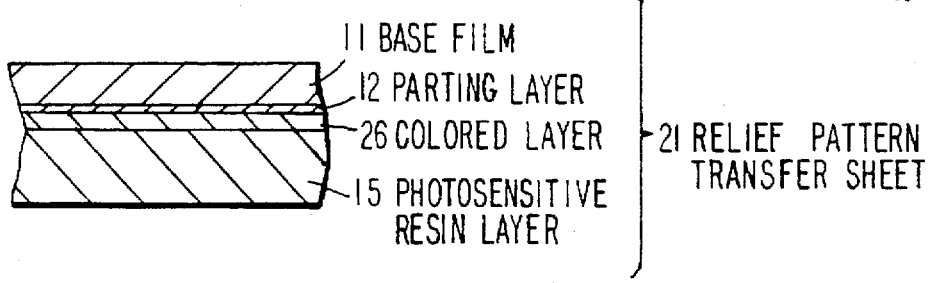
FIGS. 5 (A)–(D) are cross sections showing the structure of the relief pattern transfer sheet according to any of third–sixth embodiments.
Figure 5B:
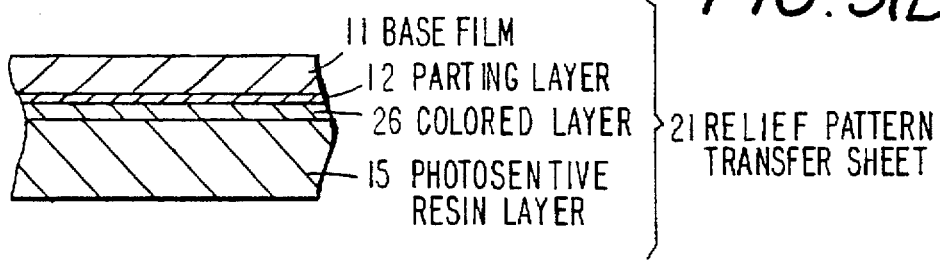
Figure 5C:
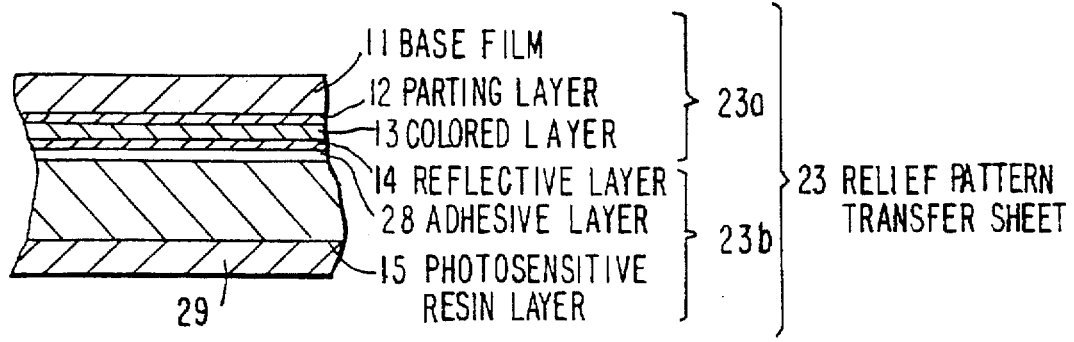
Figure 5D:
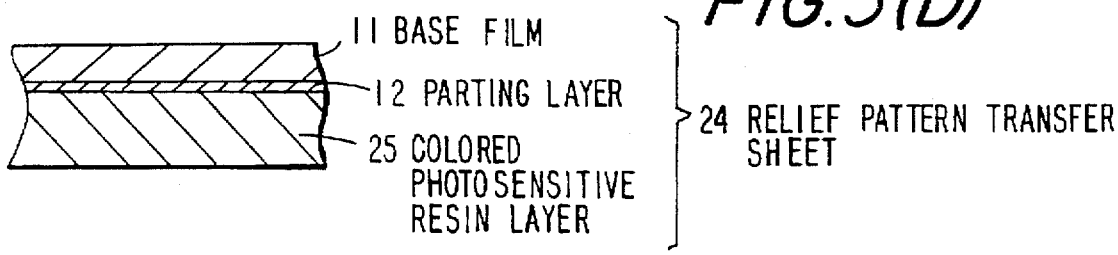

First, as shown in FIG. 3 (A), cover sheet 18 is peeled from processed relief pattern transfer sheet 10a, processed relief pattern transfer sheet 10a is placed over timepiece face 19 with pressure-sensitive adhesive layer 17 contacting timepiece face 19, and processed relief pattern transfer sheet 10a is pressed with a roller or other means against timepiece face 19 as indicated by arrow Q. This is the bonding process.

Next, as shown in FIG. 3 (B), processed relief pattern transfer sheet 10a is peeled from timepiece face 19. Because molded resin layer 150 is bonded to timepiece face 19 by pressure-sensitive adhesive layer 17 at this time, reflective layer 14 and colored layer 13 remain laminated to molded resin layer 150. As a result, when processed relief pattern transfer sheet 10a is removed, reflective layer 14 and colored layer 13 corresponding to the area in which molded resin layer 150 is formed are automatically separated from reflective layer 14 and colored layer 13 in the other areas as shown in FIG. 3 (C), and are transferred to timepiece face 19 as part of letters 191. Note that reflective layer 14 and colored layer 13 formed where molded resin layer 150 is not remain fixed to processed relief pattern transfer sheet 10a and are removed therewith. This is the transfer process.

The transferred letters 191 appear to have a gold color because colored layer 13 is a yellow ink layer and reflective layer 14 is an aluminum vapor deposition layer. In addition, letters 191 also have a three dimensional, high quality appearance because they are transferred as a relief pattern.

In addition, because the relief pattern is transferred to the decorated surface using the embossing already formed in molded resin layer 150, it is possible in the bonding process to transfer the specified relief pattern by simply applying pressure to the entire surface of processed relief pattern transfer sheet 10a. Therefore, because it is not necessary to apply pressure to processed relief pattern transfer sheet 10a using a profile having the same relief pattern, high precision relief patterns can also be transferred to decorated surfaces with curves.

When a processed relief pattern transfer sheet 10a processed to the stage shown in FIG. 2 (D) is used to transfer letters 191 to timepiece face 19 without applying cover sheet 18, pressure-sensitive adhesive layer 17 is applied to the surface of molded resin layer 150 only, and processed relief pattern transfer sheet 10a is then applied directly to timepiece face 19 as shown in FIG. 3 (A).

The thickness of photosensitive resin layer 15 may range from 0.01 mm to several millimeters depending on the shape of the relief pattern to be transferred. For example, when transferring fine relief patterns, a thick photosensitive resin layer 15 is used. When the thickness of photosensitive resin layer 15 is increased to form a more three dimensional relief pattern, it is necessary make the pattern of the negative film wider and longer to prevent the light from passing under the pattern and exposing masked areas during the exposure process. As a result, the pattern of molded resin layer 150 left after development will be a faithful positive of the negative film.

Second embodiment

FIGS. 4 (A)–(D) are cross sections used to describe the processes of the letter (relief pattern) transfer method of the second embodiment of the invention. The relief pattern transfer sheet used in this embodiment is identical in structure to the relief pattern transfer sheet used in the first embodiment described above. The structure of the relief pattern transfer sheet used in this embodiment is therefore described with reference to FIG. 1 because it is only how this sheet is used that is different in this embodiment. In addition, the pattern transfer method of this embodiment uses the processes shown in FIGS. 2 (A)–(C) and used in the description of the first embodiment above, and the description of the process of this second embodiment therefore also refers to FIGS. 2 (A)–(C).

As shown in FIG. 1, the relief pattern transfer sheet 10 of this embodiment comprises parting layer 12, an approximately 2 µm thick colored layer 13, reflective layer 14, and an approximately 0.2 mm thick photosensitive resin layer 15 laminated in sequence to the face side (the bottom side as shown in FIG. 1) of base film 11.

The processes described below are performed to transfer the letter pattern to the timepiece face using this relief pattern transfer sheet 10.

First, as shown in FIG. 2 (A), negative film 16 is applied to the surface of photosensitive resin layer 15 of relief pattern transfer sheet 10, and photosensitive resin layer 15 is exposed to parallel ultraviolet light emitted through negative film 16 as indicated by arrows P in FIG. 2 (B). Exposure at this time is approximately sixty seconds of parallel light emitted from a 4-kW extra-high pressure mercury vapor lamp positioned approximately one meter from negative film 16. This is the exposure process.

In addition to the pattern of letters 191 to be transferred to timepiece face 19, the pattern formed in negative film 16 in this embodiment includes a pattern for forming guide marks that are used to position relief pattern transfer sheet 10 to timepiece face 19. In other words, when photosensitive resin layer 15 is sprayed with a shower of developer solution to develop the pattern as shown in FIG. 2 (C), parting layer 12, colored layer 13, and reflective layer 14 remain laminated to the surface of base film 11 as shown in FIG. 4 (A); photosensitive resin layer 15 remains on the surface of reflective layer 14 in the specified pattern as molded resin layer 150; and protrusions 32 forming positioning holes 31 are also formed on reflective layer 14. This is the developing process.

Relief pattern transfer sheet 10 is then dried for approximately five minutes at 80° C., and the entire surface of photosensitive resin layer 15 is exposed to parallel ultraviolet light for postexposure of photosensitive resin layer 15. Processed relief pattern transfer sheet 30a is thus manufactured from relief pattern transfer sheet 10 by means of this photoengraving process.

Water soluble pressure-sensitive adhesive layer 17 is then formed only on the surface of molded resin layer 150 to a thickness of approximately 15 μm, and is covered as necessary with cover sheet 18 having a parting layer 181. Note that pressure-sensitive adhesive layer 17 is silk-screened using a printing plate with a printing pattern matching the pattern of molded resin layer 150, and pressure-sensitive adhesive layer 17 is therefore not formed on the surfaces of protrusions 32.

Molded resin layer 150 (the letters) is then transferred to the timepiece face using processed relief pattern transfer sheet 30a as described below.

In this transfer process, a tool 42 is used to hold timepiece face 19 as shown in FIG. 4 (B). This tool 42 has two positioning pins 43 provided around the holding position of timepiece face 19. As a result, when processed relief pattern transfer sheet 30a is overlaid to timepiece face 19, processed relief pattern transfer sheet 30a is correctly positioned to timepiece face 19 by inserting positioning pins 43 into the positioning holes 31 of protrusions 32. Note that positioning pin 44 also projects in the center of tool 42. As a result, timepiece face 19 can be correctly positioned to tool 42 by inserting positioning pin 44 into hole 192 of timepiece face 19 when holding timepiece face 19 in tool 42.

Processed relief pattern transfer sheet 30a is next pressed against timepiece face 19 using a stamp, roller, or similar means to bond processed relief pattern transfer sheet 30a to timepiece face 19 by means of pressure-sensitive adhesive layer 17. (Bonding process)

By then peeling processed relief pattern transfer sheet 30a from timepiece face 19 as shown in FIG. 4 (C), reflective layer 14 and colored layer 13 remain in the areas corresponding to the pattern of molded resin layer 150 only, and are therefore transferred as part of letters 191 to timepiece face 19. (Transfer process)

By means of the method described above, it is possible to position timepiece face 19 to processed relief pattern transfer sheet 30a without any separate processing of processed relief pattern transfer sheet 30a by simply adding in the negative film a pattern enabling formation of protrusions 32. It thus becomes possible to easily manufacture timepiece face 19 with high precision positioning of letters 191.

Third embodiment

FIG. 5 (A) is a cross section of the structure of a relief pattern transfer sheet according to a third embodiment of the invention. Note that the construction of this relief pattern transfer sheet, as well as the relief pattern transfer sheets according to the fourth through sixth embodiments described below, is essentially the same as the construction of the relief pattern transfer sheet according to the first embodiment above. Like parts are therefore identified by like reference numbers, and further detailed description thereof is omitted below. In addition, the methods of transferring a relief pattern using these various alternative relief pattern transfer sheets are the same as the methods described in the first and second embodiments above, and further description is therefore omitted below.

Relief pattern transfer sheet 21 shown in FIG. 5 (A) comprises parting layer 12, colored layer 26, and photosensitive resin layer 15 laminated to the face side of base film 11. Note that there is no reflective layer. Colored layer 26 is a resin layer of a colored translucent or transparent ink, coating, or other pigmented material. As a result, letters 191 (relief patterns) transferred using the relief pattern transfer sheet 21 of this embodiment can be provided with, in addition to a three dimensional profile, a tone having the characteristic texture or warmth of the finish coating or printing. In addition, the desired tone can be easily imparted because colored layer 26 is an ink or coating.

Fourth embodiment

FIG. 5 (B) is a cross section of the structure of a relief pattern transfer sheet according to a fourth embodiment of the invention.

Relief pattern transfer sheet 22 shown in FIG. 5 (B) comprises parting layer 12, colored reflective layer 27, and photosensitive resin layer 15 laminated to the face side of base film 11. Colored reflective layer 27 is a film of aluminum, zirconium, niobium, cobalt, platinum, palladium, indium, vanadium, chrome, silver, gold, silicon, or another metal or metallic compound deposited by means of a method such as vapor deposition to a film thickness of approximately 0.01 μm to 0.5 μm. In addition to a three dimensional profile, letters 191 (relief patterns) transferred using the relief pattern transfer sheet 22 of this embodiment can therefore be provided with, by means of the metallic colored reflective layer 27, a metallic appearance and feeling of high quality suggesting application of a decorative plating.

Fifth embodiment

FIG. 5 (C) is a cross section of the structure of a relief pattern transfer sheet according to a fifth embodiment of the invention.

Relief pattern transfer sheet 23 shown in FIG. 5 (C) comprises parting layer 12, colored layer 13, reflective layer 14, a hot melt type adhesive layer 28, and photosensitive resin layer 15 laminated to the face side of base film 11.

This relief pattern transfer sheet 23 is manufactured by bonding metallic foil 23a to photosensitive resin sheet 23b by means of adhesive layer 28, and then peeling off base film 29. Metallic foil 23a is made by laminating parting layer 12, colored layer 13, and reflective layer 14 to the face side of base film 11. Photosensitive resin sheet 23b is made by roll coating and hardening photosensitive resin layer 15 to a separate base film 29, which is pre-processed with a parting agent.

Therefore, by pre-manufacturing metallic foil 23a and photosensitive resin sheet 23b, relief patterns can be easily transferred, and this method is thus suited to small lot production of many different patterns.

When pre-manufactured metallic foil 23a and photosensitive resin sheet 23b are used, adhesive layer 28 also simplifies the process of bonding metallic foil 23a to photosensitive resin sheet 23b. In addition, this method of manufacturing relief pattern transfer sheet 23 makes it possible to use a hologram foil, pigmented foil, or other foil sheet for metallic foil 23a.

It should be further noted that a pressure-sensitive adhesive can be used in place of the hot melt adhesive mentioned above as adhesive layer 28. When a pressure-sensitive adhesive is used, the water soluble, pressure-sensitive adhesive, for example, can be applied to the metallic foil 23a, hologram foil, or pigmented foil, and the foil can then be bonded to photosensitive resin sheet 23b while applying pressure with a laminator.

When letters 191 to be transferred to timepiece face 19 are formed as the relief pattern using relief pattern transfer sheet 23 as constructed above, photosensitive resin layer 15 is exposed to parallel ultraviolet light through negative film 16 as in the first and second embodiments above. Photosensitive resin layer 15 is then selectively removed by developer, and the remaining molded resin layer 150, and colored layer 13 and reflective layer 14 in the same area as molded resin layer 150, are transferred to timepiece face 19 as letters 191. An adhesive with good tear properties and high adhesive strength even in thin layers must therefore be used for adhesive layer 28.

As a result, the photosensitive emulsion comprising photosensitive resin layer 15 can itself be used as adhesive layer 28. In this case, adhesive layer 28 is formed to the same specified pattern by exposure and developing as photosensitive resin layer 15 after photosensitive resin sheet 23b is bonded with metallic foil 23a, and the tear properties of adhesive layer 28 will pose no problem during the transfer of letters 191.

It is also possible to simplify the process of bonding metallic foil 23a and photosensitive resin sheet 23b when a water soluble photosensitive resin layer 15 is used because misting a water soluble photosensitive resin layer 15 with water will make the resin layer adhesive.

Sixth embodiment

FIG. 5 (D) is a cross section of the structure of a relief pattern transfer sheet according to a sixth embodiment of the invention.

The relief pattern transfer sheet 24 of this embodiment is made by simply laminating a parting layer 12 and photosensitive resin layer 25 to the face side of base film 11.

In relief pattern transfer sheet 24, photosensitive resin layer 25 is colored by dye or pigment, and separate colored, reflective, or colored reflective layers are not formed. Note that the type and loading of the dye or coloring is adjusted so that the sensitized groups in the polymer chain of the photosensitive component of photosensitive resin layer 25 will react when photosensitive resin layer 25 is exposed to light in the exposure process.

Because only two layers are laminated to base film 11 of relief pattern transfer sheet 24, the manufacturing process therefor can be simplified. In addition, well defined letters 191 can be formed because photosensitive resin layer 25 transferred to timepiece face 19 is preformed to the desired pattern by the exposure and developing processes.

Seventh embodiment

Figure 6:
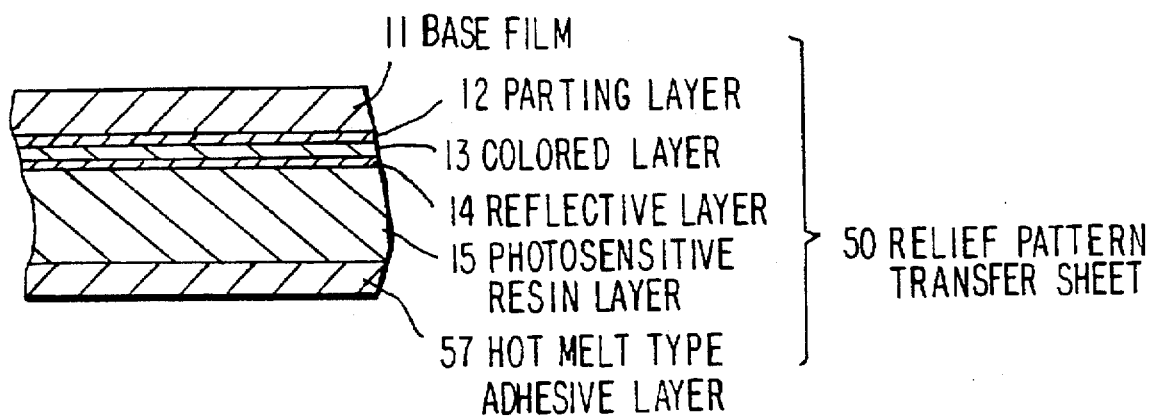
FIG. 6 is a cross section showing the structure of a relief pattern transfer sheet according to a seventh embodiment of the invention.
Figure 7A:
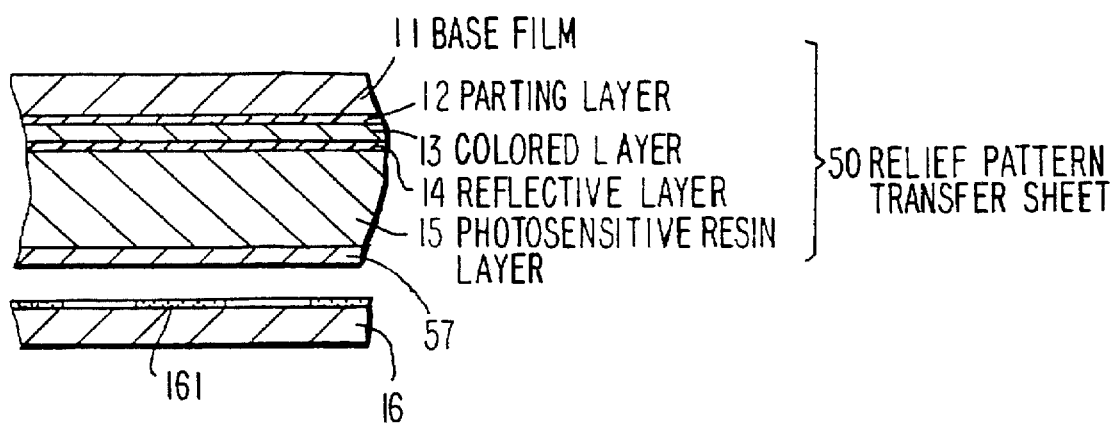
FIGS. 7 (A)–(D) are cross sections used to describe the processes of the method for transferring the character pattern formed in the relief pattern transfer sheet shown in FIG. 6 to the lettered panel.
Figure 7B:
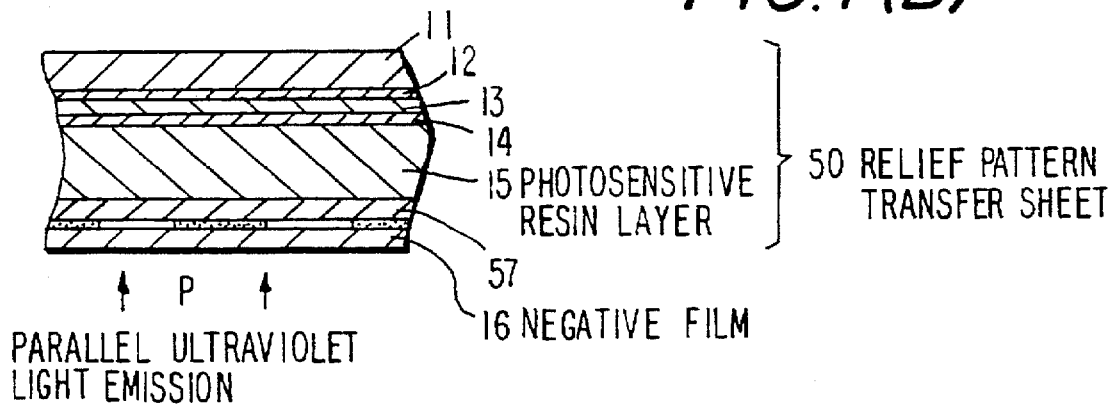
Figure 7C:
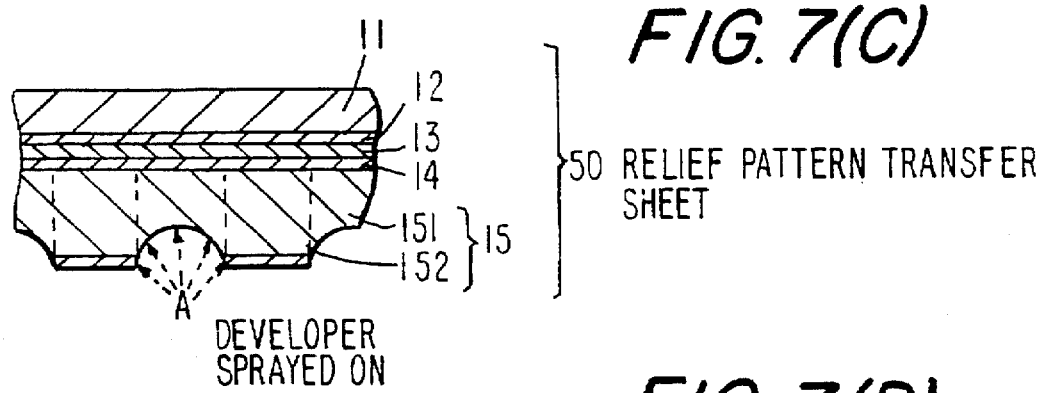
Figure 7D:
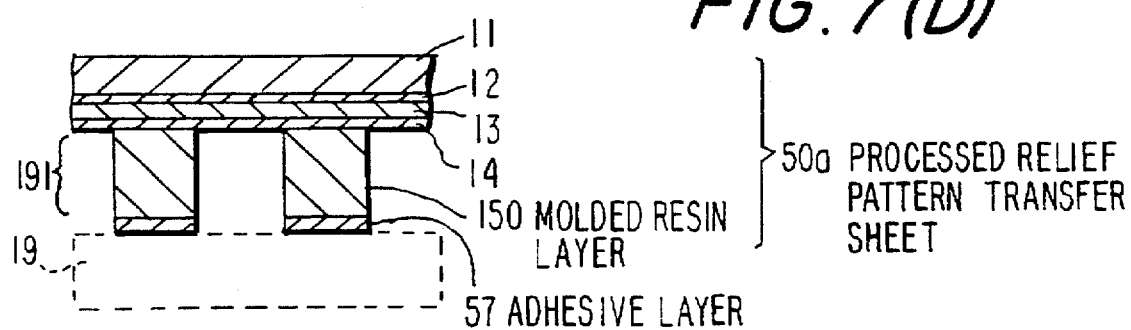

FIG. 6 is a cross section of the structure of a relief pattern transfer sheet according to a seventh embodiment of the invention. Note that the construction of this relief pattern transfer sheet is essentially the same as the construction of the relief pattern transfer sheet according to the first embodiment above. Like parts are therefore identified by like reference numbers, and further detailed description thereof is omitted below.

Referring to FIG. 6, relief pattern transfer sheet 50 of this embodiment comprises parting layer 12, an approximately 2 µm thick colored layer 13, reflective layer 14, and an approximately 0.2 µm thick photosensitive resin layer 15 laminated to the face side (the bottom side as shown in the figure) of base film 11.

Base film 11 is a 0.02 mm thick polyester sheet, the surface of which is treated with a parting agent to form parting layer 12.

A thin, transparent, hot melt type adhesive layer 57 is formed on the exposed side of photosensitive resin layer 15 of relief pattern transfer sheet 50 at this stage. This hot melt type adhesive layer 57 becomes adhesive when heated between approximately 80° C. and approximately 170° C. When photosensitive resin layer 15 is patterned in this embodiment, photosensitive resin layer 15 is exposed to ultraviolet light through hot melt type adhesive layer 57 as will be described below. A transparent, smooth-surfaced material is therefore used for hot melt type adhesive layer 57 to prevent blurring of the pattern due to irregular reflections during the exposure process. In addition, an approximately 1 µm to approximately 15 µm thick layer of a material with the ability to pass water is also applied to hot melt type adhesive layer 57 because the developer solution is supplied to photosensitive resin layer 15 through hot melt type adhesive layer 57 during the developing process with this embodiment.

The processes described below are used to form the letters (relief pattern) on the face (decorated surface) of a timepiece, for example, using relief pattern transfer sheet 50 according to the present embodiment. These processes are essentially identical to the processes of the manufacturing method of the first embodiment described above. Only the unique features of the processes are therefore described below, and further description of common processes is omitted.

First, as shown in FIG. 7 (A), negative film 16 is applied over photosensitive resin layer 15 against hot melt type adhesive layer 57. Mask areas 161 are formed in negative film 16 in a pattern that is the negative of the letters to be transferred to the timepiece face (decorated surface).

Next, as indicated by arrows P in FIG. 7 (B), photosensitive resin layer 15 is exposed to parallel ultraviolet light emitted through negative film 16. Exposure at this time is approximately sixty seconds of parallel light emitted from a 4-kW extra-high pressure mercury vapor lamp positioned approximately one meter from negative film 16.

As a result, areas 151 of photosensitive resin layer 15 masked by mask areas 161 are not hardened by exposure, and are therefore dissolved and removed when photosensitive resin layer 15 is sprayed with a shower of developer solution as indicated by arrows A in FIG. 7 (C). Areas 152 of photosensitive resin layer 15 that were not masked by mask areas 161 are hardened by exposure, and are therefore not dissolved by the developer and remain. It is to be noted that because the developer solution is supplied to photosensitive resin layer 15 through hot melt type adhesive layer 57, the developing time must be increased, and the water pressure and volume must be increased, to assure sufficient time for the developer to pass through hot melt type adhesive layer 57 and penetrate photosensitive resin layer 15.

As a result, photosensitive resin layer 15 is left as molded resin layer 150 on the surface of reflective layer 14 with parting layer 12, colored layer 13, and reflective layer 14 also remaining on the surface of base film 11 as shown in FIG. 7 (D).

Relief pattern transfer sheet 50 is then dried for approximately five minutes at 80-C, and the entire surface of molded resin layer 150 is exposed to parallel ultraviolet light for postexposure.

By means of this photoengraving process, relief pattern transfer sheet 50 becomes processed relief pattern transfer sheet 50a.

The process for forming the letters on the timepiece face using this processed relief pattern transfer sheet 50a is basically the same as in the first embodiment: the hot melt type adhesive layer 57 of processed relief pattern transfer sheet 50a is placed on the surface of timepiece face 19, and processed relief pattern transfer sheet 50a is then hot-stamped (bonding process).

It is to be noted that this hot stamping step can also be applied from the reverse side of timepiece face 19. It is preferable, however, to apply heat from both the reverse side of timepiece face 19 and processed relief pattern transfer sheet 50a in order to minimize heat deformation of molded resin layer 150.

When processed relief pattern transfer sheet 50a is then peeled from timepiece face 19, reflective layer 14 and colored layer 13 are transferred with molded resin layer 150 as letters 191 to timepiece face 19 only in the area in which molded resin layer 150 is formed. (Transfer process)

As described above, because hot melt type adhesive layer 57 is formed on relief pattern transfer sheet 50 of this embodiment before processing, it is not necessary to selectively coat hot melt type adhesive layer 57 to the patterned photosensitive resin layer 15 after exposure and developing processes are completed. As a result, the overall manufacturing process can be simplified, and stable production yields can be achieved.

Alternative of the seventh embodiment

Figure 8A:
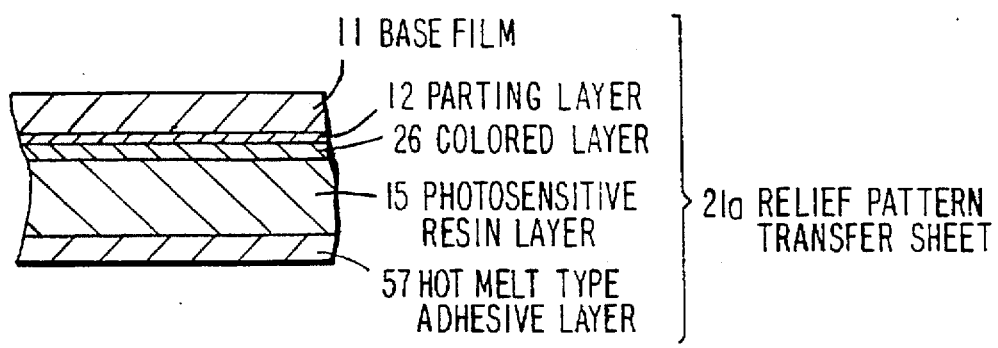
FIGS. 8 (A)–(C) are cross sections showing the structures of relief pattern transfer sheets according to alternative embodiments of the seventh embodiment of the invention.
Figure 8B:
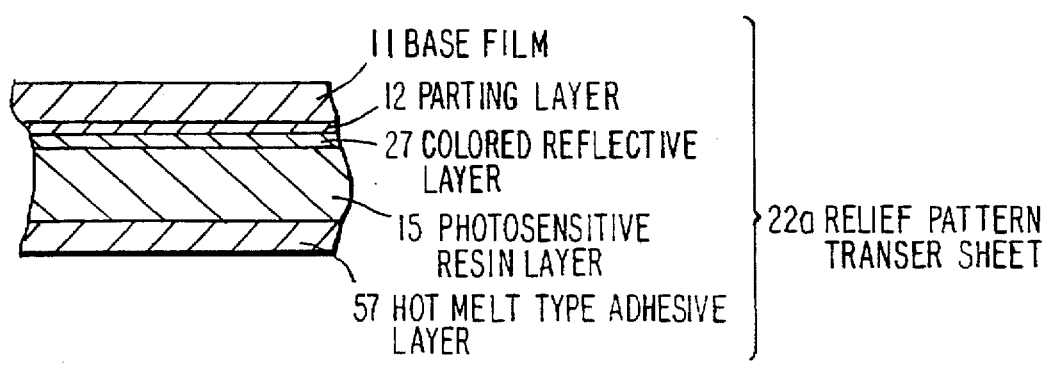
Figure 8C:
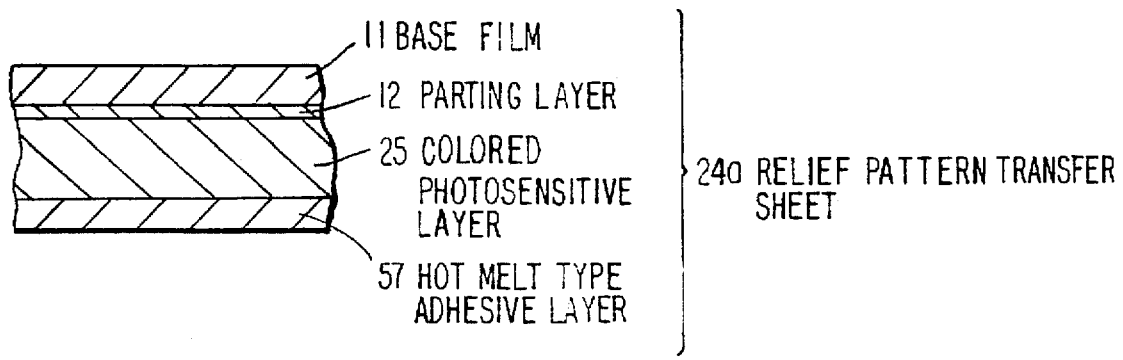
Figure 9A:
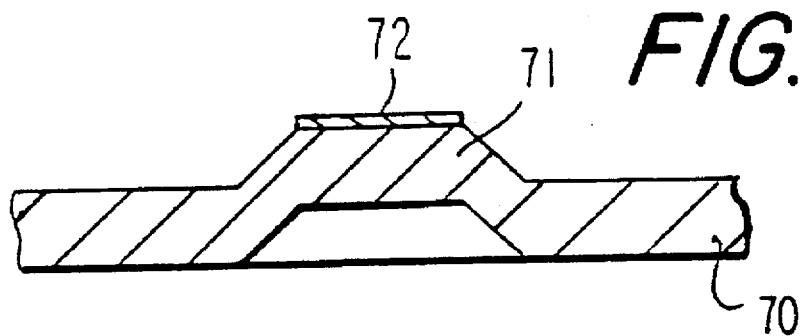
FIGS. 9 (A)–(C) are cross sections used to describe the conventional method of forming a relief pattern.
Figure 9B:
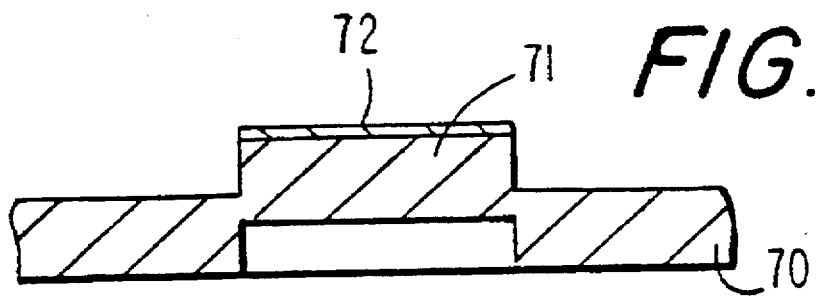
Figure 9C:
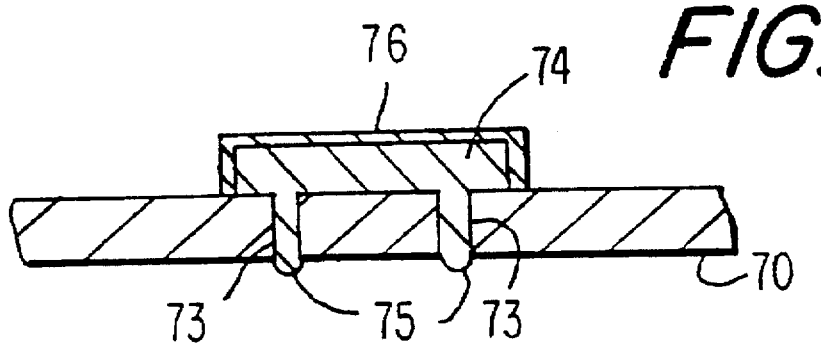
Figure 10A:
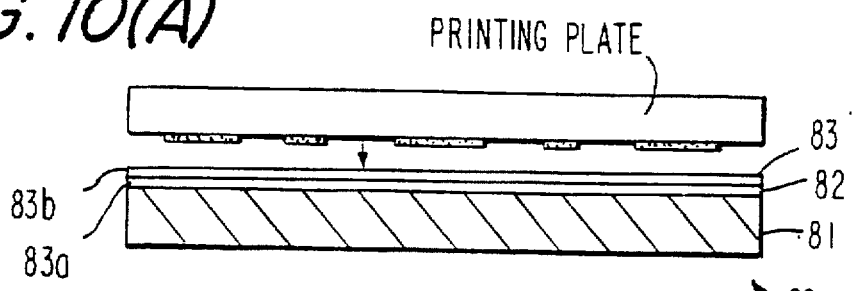
FIGS. 10 (A)–(E) are cross sections used to describe an alternative conventional method for forming a relief pattern.
Figure 10B:
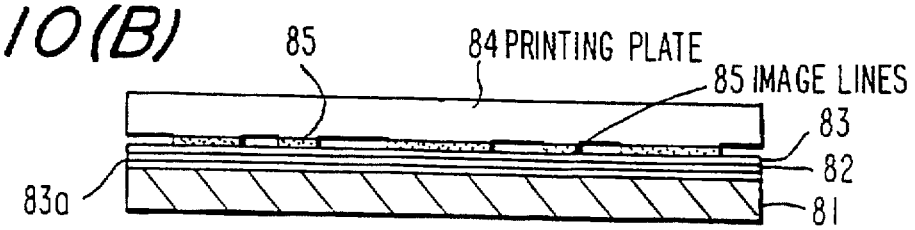
Figure 10C:
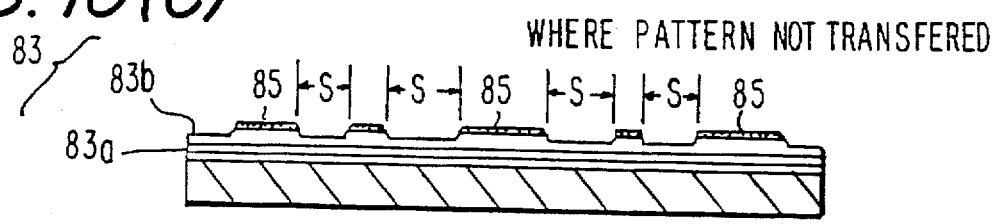
Figure 10D:
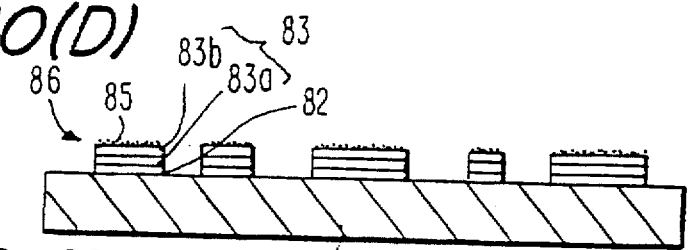
Figure 10E:
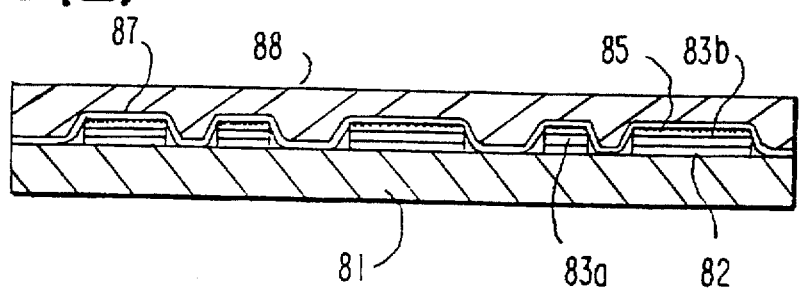
Figure 11A:
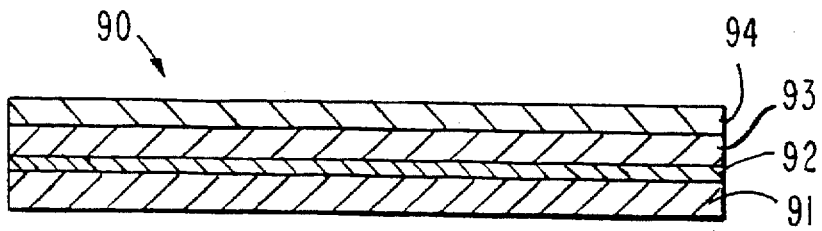
FIGS. 11 (A)–(E) are cross sections used to describe another alternative conventional method for forming a relief pattern.
Figure 11B:
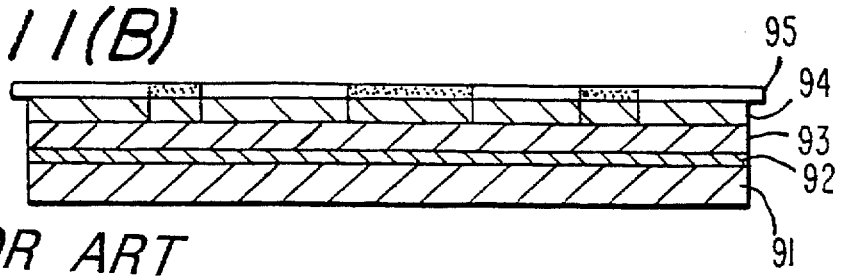
Figure 11C:
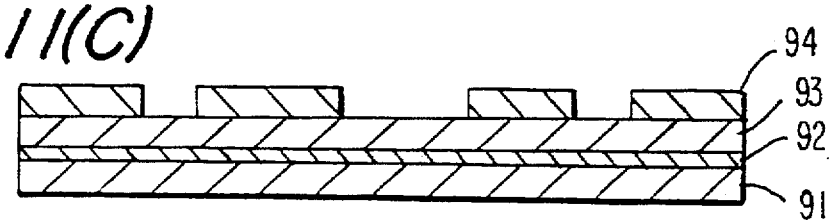
Figure 11D:
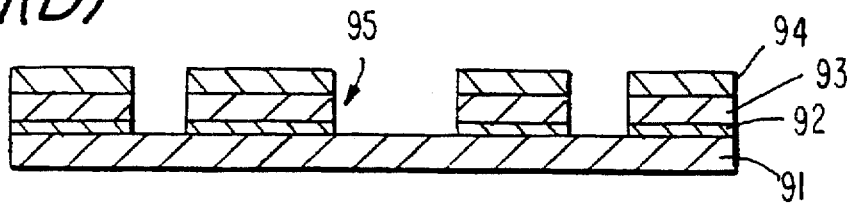
Figure 11E:
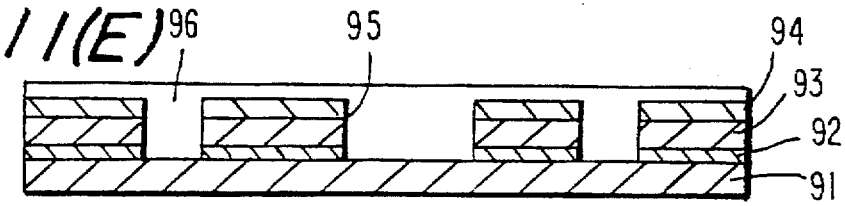

The relief pattern transfer sheets shown in FIGS. 8 (A)-(C) can be alternatively used in the method of forming the relief pattern of the seventh embodiment described above.

FIG. 8 (A) is a cross section of a relief pattern transfer sheet according to a first alternative to the seventh embodiment above. This alternative relief pattern transfer sheet is characterized by forming an adhesive layer as in the seventh embodiment on a relief pattern transfer sheet according to the third embodiment of the invention before patterning the photosensitive resin layer.

Specifically, relief pattern transfer sheet 21a shown in FIG. 8 (A) comprises parting layer 12, colored layer 26, photosensitive resin layer 15, and hot melt type adhesive layer 57 laminated to the face side of base film 11. Note that there is no reflective layer. Colored layer 26 is a resin layer of a colored translucent or transparent ink, coating, or other pigmented material. As a result, the various benefits of the third embodiment, including the ability to create colored relief patterns with the characteristic texture or warmth of the finish coating or printing, can also be achieved. In addition, the benefits of the seventh embodiment, particularly not needing to selectively coat hot melt type adhesive layer 57 to the patterned photosensitive resin layer 15 after exposure and developing because hot melt type adhesive layer 57 is formed on relief pattern transfer sheet 21a before processing, are also achieved.

FIG. 8 (B) is a cross section of a relief pattern transfer sheet according to a second alternative to the seventh embodiment, and is characterized by pre-forming an adhesive layer as in the seventh embodiment on a relief pattern transfer sheet according to the fourth embodiment described above.

Specifically, relief pattern transfer sheet 22a shown in FIG. 8 (B) comprises parting layer 12, colored reflective layer 27, photosensitive resin layer 15, and hot melt type adhesive layer 57 laminated to the face side of base film 11. Colored reflective layer 27 is a film of aluminum, zirconium, niobium, cobalt, platinum, palladium, indium, vanadium, chrome, silver, gold, silicon, or another metal or metallic compound deposited by means of a method such as vapor deposition to a film thickness of approximately 0.01 µm to 0.5 µm.

The benefits of the seventh embodiment, particularly not needing to selectively coat hot melt type adhesive layer 57 after exposure and developing because hot melt type adhesive layer 57 is pre-formed, are also achieved by the present embodiment.

FIG. 8 (C) is a cross section of a relief pattern transfer sheet according to a third alternative to the seventh embodiment, and is characterized by pre-forming an adhesive layer as in the seventh embodiment on a relief pattern transfer sheet according to the sixth embodiment described above.

Specifically, relief pattern transfer sheet 24a shown in FIG. 8 (C) comprises parting layer 12, photosensitive resin layer 25, and hot melt type adhesive layer 57 laminated to the face side of base film 11. Photosensitive resin layer 25 is colored by dye or pigment, and separate colored, reflective, or colored reflective layers are not formed.

As a result, the benefits of the sixth embodiment, including simplifying the manufacturing process of relief pattern transfer sheet 24a, can be achieved. In addition, the benefits of the seventh embodiment, particularly not needing to selectively coat hot melt type adhesive layer 57 after exposure and developing because hot melt type adhesive layer 57 is pre-formed, are also achieved by the present embodiment.

Other embodiments

It is to be noted that the above embodiments can be varied in many ways, including, for example, adding luminous pigments to photosensitive resin layer 15 or 25. If photosensitive resin layer 15 or 25 containing a luminous pigment or afterglow pigment is used in, for example, relief pattern transfer sheet 24 comprising only parting layer 12 and photosensitive resin layer 25 laminated to base film 11 as described in the sixth embodiment, letters 191 that can be recognized in the dark can be transferred to the decorated surface. In addition, if photosensitive resin layer 15 or 25 containing a luminous pigment is used in a relief pattern transfer sheet comprising a colored layer, reflective layer, or colored reflective layer as in the first embodiment, letters 191 of which only the sides are luminescent in the dark can be transferred to the decorated surface.

Pressure-sensitive adhesive layer 17 is used for bonding letters 191 to timepiece face 19 in the first through sixth embodiments above, but a hot melt type adhesive layer can be used in place of pressure-sensitive adhesive layer 17. Similarly, while hot melt type adhesive layer 57 is used to bond letters 191 to timepiece face 19 in the seventh embodiment and alternatives thereof described above, a pressure-sensitive adhesive layer can be used in place of this hot melt adhesive layer.

In the first, second, and seventh embodiments, it is possible to use a colorless, transparent colored layer 13 in the relief pattern transfer sheets shown in FIGS. 1 and 6. In this case, the surface of colored layer 13 (the raised parts of the pattern) can be printed with a colored transparent or colored translucent ink, coating, or other resin after letters 191 are formed as raised letters on timepiece face 19 as shown in FIG. 3 (B) and FIG. 4 (D). Because this method makes it possible to use a common relief pattern transfer sheet, letters 191 of different colors can be formed without the work otherwise required to change the relief pattern transfer sheet. This method is therefore suited to reducing production costs and turn-around times.

Furthermore, photosensitive resin layer 15 or 25 may be either a negative or positive type resin. It is simply necessary to using a patterning film of the corresponding type.

Finally, while a timepiece face 19 has been used as an example of the decorated surface to which letters 191 for displaying the time are applied as relief patterns, the type of the decorated surface, and the type of the raised letters, marks, or other relief pattern transferred to the decorated surface, shall not be so limited.

Effect of the invention

As described hereinabove, the present invention is characterized by adding a colored layer or reflective layer to a base film, laminating a photosensitive resin layer thereto, and patterning this photosensitive resin layer with the relief pattern to be transferred to a decorated surface with high precision using photoengraving technologies. Therefore, if the relief pattern transfer sheet with a patterned photosensitive resin layer is bonded to the timepiece face or other decorated surface, and the relief pattern transfer sheet is then peeled from the decorated surface according to the present invention, the photosensitive resin layer will be bonded as a raised pattern to the timepiece face, and the colored layer and/or reflective layer laminated to this photosensitive resin layer will be automatically separated from the rest of the colored layer and/or reflective layer, and transferred with the photosensitive resin layer to the decorated surface. As a result, raised patterns ranging in thickness from a thin 0.01 mm to a relatively thick 0.5 mm can be easily transferred with equal high precision. In addition, it is not necessary to perform press processes, polishing, plating, etching processes using organic solvents, and coating processes requiring high cost profiles that take a long time to produce.

What is claimed:

1. A three-dimensional relief pattern transfer method comprising the steps of:

providing a base film having a front surface side;

applying a parting layer to said front surface side of said base film;

releasably securing a photosensitive resin layer in a thickness of from 0.01 mm to 0.5 mm to said parting layer;

forming said photosensitive resin layer into a predetermined pattern by means of a photoengraving technique and;

applying an adhesive layer only to the portions of said photosensitive resin layer formed in said predetermined pattern after said forming step said portion of said photosensitive resin layer formed into said predetermined pattern and the adhesive layer applied thereto defining a removable relief pattern.

2. The three-dimensional relief pattern transfer method according to claim 1, further comprising the steps of bonding said relief pattern to a surface to be decorated by bonding a surface of said photosensitive resin layer formed into said pattern to a surface to be decorated by means of said adhesive layer; and transferring said relief pattern to said surface to be decorated by peeling said relief pattern from said base film.

3. A three-dimensional relief pattern transfer method comprising the steps of:

providing a base film having a front surface side;

applying a parting layer to said front surface side of said base film;

releasably securing a photosensitive resin layer in a thickness of from 0.01 mm to 0.5 mm to said parting layer;

forming said photosensitive resin layer into a predetermined pattern by means of a photoengraving technique; and applying an adhesive layer to said photosensitive resin layer, said adhesive being maintained adjacent only the portion of said photosensitive layer formed into said predetermined pattern, said portion of said photosensitive resin layer formed into said predetermined pattern and the adhesive layer applied thereto defining a removable relief pattern.

4. The three-dimensional transfer method according to claim 3, further comprising the step of applying a colored layer intermediate said parting layer and said photosensitive resin layer so that regions of said colored layer in registration with the pattern into which the photosensitive resin layer is formed separates from the remaining portions of said colored layer to form a part of said relief pattern when said relief pattern is separated from the base film.

5. The three-dimensional relief pattern transfer method according to claim 3, further comprising the steps of:

applying a colored layer and a metallic layer made from a metal or a metallic compound intermediate said parting layer and said photosensitive resin layer so that regions of said colored and metallic layers in registration with the pattern into which said photosensitive resin layer is formed separate from the remaining portions of said colored and metallic layers to form a part of said relief pattern when said relief pattern is separated from said base film.

6. The three-dimensional relief pattern transfer method according to claim 3 further the comprising the step of:

applying a colored reflective layer made from a metallic or a metallic compound intermediate said parting layer and said photosensitive resin layer so that regions of said colored reflective layer in registration with the pattern into which said photosensitive resin layer is formed separate from the remaining portions of said colored reflective layer to form a part of said relief pattern when said relief pattern is separated from said base film.

7. The relief pattern transfer method according to any of claims 3–6, wherein said photosensitive resin layer is dyed or colored.

8. The relief pattern transfer method according to any of claims 3–6 wherein said photosensitive resin layer is a photosensitive resin sheet applied by said parting layer to the base film.

9. The relief pattern transfer method according to any of claim 3–6, further comprising the steps of:

patterning the photosensitive resin layer according to the shapes of characters used to display the time; and transferring the said relief pattern in the form of said characters to the face of a timepiece, to decorate the surface thereof.

10. The three-dimensional relief pattern transfer method of claims 3–6, wherein said photosensitive resin layer is water soluble.

11. A three-dimensional relief pattern transfer method comprising the steps of:

providing a base film having a front surface side:

applying a parting layer to said front surface side of said base film;

releasably securing a photosensitive resin layer in a thickness of from 0.01 mm to 0.5 mm to said parting layer;

forming said photosensitive resin layer into a predetermined pattern by means of a photoengraving technique;

applying an adhesive layer at least to the portion of said photosensitive resin layer formed into said predetermined pattern, said portion of said photosensitive resin layer formed into said predetermined pattern and the adhesive layer applied thereto defining a removable relief pattern; and forming said adhesive layer by:

coating a layer of adhesive over the complete surface of the photosensitive resin layer before the photoengraving process; and patterning said layer of adhesive along with the photosensitive resin layer in the photoengraving process.

12. The three-dimensional relief pattern transfer method according to claim 11, further comprising the steps of bonding said relief pattern to a surface to be decorated by bonding a surface of said photosensitive resin layer formed into said pattern to a surface to be decorated by means of said adhesive layer; and transferring said relief pattern to said surface to be decorated by peeling said relief pattern from said base film.

13. A three-dimensional relief pattern transfer method comprising the steps of:

providing a base film having a front surface side;

applying a parting layer to said front surface side of said base film;

releasably securing a photosensitive resin layer in a thickness of from 0.01 mm to 0.5 mm to said parting layer;

forming said photosensitive resin layer into a predetermined pattern by means of a photoengraving technique;

applying an adhesive layer at least to the portion of said photosensitive resin layer formed into said predetermined pattern said portion of said photosensitive resin layer formed into said predetermined pattern and the adhesive layer applied thereto defining a removable relief pattern;

forming positioning tabs from the photosensitive resin layer during formation of the pattern in said photosensitive resin layer in the photoengraving process; and positioning the relief pattern relative to the face of a surface to be decorated based on said positioning tabs.

* * * * *